United States Patent [19]

Kaplit

[11] Patent Number: 4,498,781
[45] Date of Patent: Feb. 12, 1985

[54] DATA COMPRESSION SYSTEM FOR A PHOTOMETER

[75] Inventor: Michael Kaplit, Newark, Del.

[73] Assignee: E. I. Du Pont de Nemours and Company, Wilmington, Del.

[21] Appl. No.: 296,851

[22] Filed: Aug. 27, 1981

[51] Int. Cl.³ .............................................. G01N 21/22
[52] U.S. Cl. ................................... 356/435; 356/123; 250/205
[58] Field of Search ............... 356/435, 121, 222, 123; 250/205

[56] References Cited

U.S. PATENT DOCUMENTS

| 3,173,983 | 3/1965 | Engle | 250/205 |
|---|---|---|---|
| 3,970,393 | 7/1976 | Krygeris et al. | 356/435 |
| 4,080,075 | 3/1978 | Berg | 356/435 |

OTHER PUBLICATIONS

Analog Devices, Inc., "Analog-Digital Conversion Handbook", D. H. Sheingold, Editor, Jun. 1972, pp. II-48 to II-52.

Primary Examiner—R. A. Rosenberger

[57] ABSTRACT

A data compression system includes a logarithmic ratioing network configured from only two chopper stabilized operational amplifiers connected to a dual slope analog-to-digital converter having a signal integrate time $t_{int}$. The system is characterized in that the chopping frequency of the chopper stabilized operational amplifiers is equal to the inverse of an integer number N times the signal integrate time of the converter. For the analog-to-digital converter to average to zero the noise output due to chopping, the chopper stabilized operational amplifiers are driven together at the chopping frequency.

2 Claims, 2 Drawing Figures

4,498,781

DATA COMPRESSION SYSTEM FOR A PHOTOMETER

BACKGROUND OF THE INVENTION

This invention relates to a data compression system for use with an apparatus for photometrically analyzing a sample. In particular the invention relates to a data compression system using a logarithmic rationing network configured from only two chopper stabilized operational amplifiers.

A clinical instrument adapted to automatically analyze a sample of a patient's body fluid, such as the device sold by E. I. du Pont de Nemours and Company under the trademark ACA, utilizes a beam of incident light having a predetermined intensity which is directed through a container or cuvette in which the sample of a patient's body fluid is contained. A detector is utilized to measure the intensity of the light beam transmitted through the cuvette carrying the sample of body fluid. A second detector is disposed to provide a second electrical signal representative of the incident light directed toward the sample.

The signals representative of the incident and transmitted light are applied to a ratio signal generator and are utilized to generate a signal representative of the light absorbance of the sample. The resulting analog output signal may be converted to a digital representation, if desired.

Because of the wide range of signal magnitudes involved, the ratio signal generator preferably takes the form of a logarithmic rationing network. Such a network compresses the data to facilitate further handling. A silicon photocell is preferably utilized for each of the detectors. A silicon photocell exhibits minimum thermal drift when it operates into zero volts, i.e., an effective short circuit. Therefore it is preferred that the logarithmic rationing network be realized using chopper stabilized operational amplifiers which exhibit a low input offset voltage insensitive to temperature. In addition, if digitization is desired, a dual slop analog-to-digital converter is preferred because its high resolution, conversion accuracy and low cost lend itself for this application area.

However, it has been observed that the voltage signal output from a logarithmic rationing network of the type which utilizes chopper stablized operational amplifiers produces a periodic noise signal whose average value is not equal to zero. This noise component distorts the output voltage signal to an extent such that applying the output signal to a dual slop analog-to-digital converter the noise component imparts an undesirable error factor into the conversion process which results in an erroneous digital representation of the ratio of the detected light intensities.

Accordingly, it is believed advantageous to provide a logarithmic rationing network utilizing chopper stabilized operational amplifiers able to produce an output signal representative of the ratio of detected light intensities in which the average value of the noise component of the output signal is zero. Such an output signal may be used in conjunction with a dual slope analog-to-digital converter to give a true digital representation of the ratio.

SUMMARY OF THE INVENTION

This invention relates to a data compression system for use with an apparatus for photometrically analyzing a sample. The analysis apparatus includes a first detector for generating a first analog electrical signal representative of the intensity of light transmitted through the sample and a second detector for generating a second analog signal representative of the intensity of light incident on the sample. The data compression system comprises a logarithmic ratioing network configured of a first and a second chopper stabilized operational amplifier, the network being adapted to generate an analog signal functionally related to the ratio of the first and second analog signals. The analog signal output of the ratioing network is applied to a dual slope analog-to-digital converter having a predetermined signal integrate time $t_{int}$.

The data compression system is characterized in that the chopping frequency $f_{chop}$ of the chopper stabilized operational amplifiers is inversely proportional to an integer number N times the signal integrate time $t_{int}$. Stated in another way, the period of the signal integrate time signal $t_{int}$ is N times the period of the chopping signal $t_{chop}$ applied to the chopper stabilized operational amplifiers. Because each of the chopper stabilized operational amplifiers is clocked at the frequency $f_{chop}$ the average value of the noise component of the output signal due to chopping is zero. The dual slope analog-to-digital converter thus integrates N periods of zero average noise component so that a noise component due to chopping does not appear at the output of the dual slope analog-to-digital converter.

BRIEF DESCRIPTION OF THE DRAWINGS

The invention may be more fully understood from the following detailed description thereof taken in connection with the accompanying drawings in which.

DETAILED DESCRIPTION OF THE INVENTION

Figure 1:
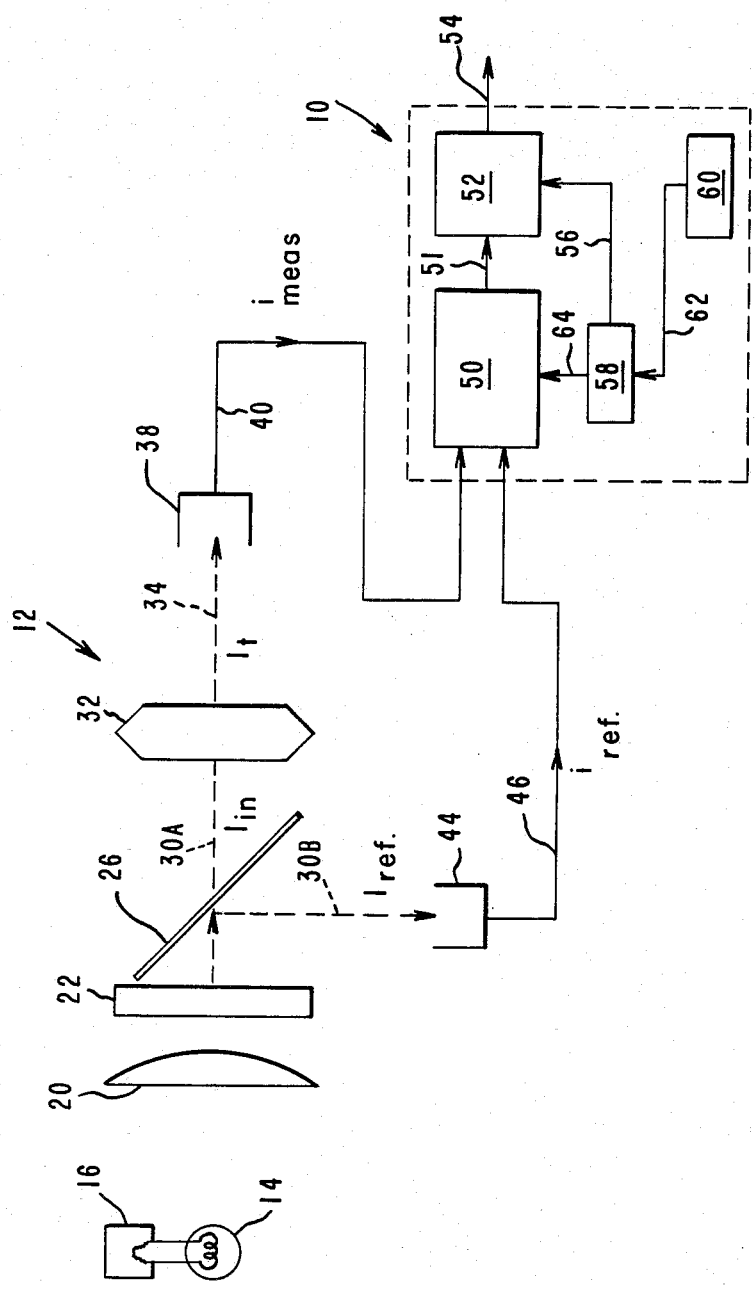
FIG. 1 is a highly stylized schematic diagram of a photometer arrangement with which a data compression system in accordance with the instant invention may be utilized.

Throughout the detailed description similar reference numerals refer to similar elements in all figures of the drawings.

With reference to FIG. 1 shown is a highly stylized schematic representation of a photometer arrangement useful in an automatic clinical analyzing instrument with which a data compression system 10 in accordance the teachings of the instant invention has been associated. The photometer, generally indicated by the reference character 12, includes a source 14 of incident radiation replaceably received within a socket 16. The source 14 may take the form of an incandescent lamp emitting light from the near UV through the visible into the near IR. The light energy produced from the source 14 is collimated by a lens 20 and directed through a suitable light filter 22. A beam splitting element 26, such as a sheet of glass, splits the beam of incident radiation and directs a first portion having an intensity $I_{in}$ and a second portion having an intensity $I_{ref}$ along a first and a second ray path 30A and 30B respectively. Radiation along the first ray path 30A passes through a cuvette 32 in which a sample of a patient's body liquid is contained. Dependent upon the reaction between the body liquid and the chemical reagents introduced into a sample of the body liquid, some portion of the incident radiation energy directed into the cuvette 32 is absorbed by the sample therein. The transmitted radiation beam 34 having an intensity $I_t$ passing through the cuvette 32 is directed toward the surface of a suitable detector element 38, such as a silicon photocell. The magnitude of the intensity $I_t$ of the transmitted beam 34 incident on the detector 38 generates an analog electrical current signal designated $i_{meas}$ which is applied over a shielded line 40 to the data compression system 10. Suitable for use as the detector 38 is a device manufactured by Hamamatsu Corporation and sold under model number 1227-1010BR.

Interposed in the second ray path 30B is a second detector 44, similar to the detector 38. The intensity $I_{ref}$ of the radiation beam impinging upon the second detector 44 generates a second electrical current $i_{ref}$ which is applied over a shielded cable 46 to the data compression network 10. As noted earlier, silicon photocell exhibits minimum thermal drift when it operates into zero volts, i.e., an effective short circuit.

In accordance with the instant invention data compression network 10 includes a logarithmic ratioing network 50 the output of which is connected by a line 51 to a dual slope analog-to-digital converter 52. Suitable for use as the converter 52 is a device manufactured by Intersil Inc. of Cupertino, Calif. and sold under model number ICL 7104/8068. The operator of the dual slope analog-to-digital converter is discussed in Intersil Application Bulletin AO-17. The converter integrates the signal input thereto for a predetermined signal integrate time period $t_{int}$. The digital representation of the analog input signal is carried by an output bus 54 emanating from the converter 52. The signal integrate time $t_{int}$ is derived from a train of clock pulses applied to the converter 52 on a line 56 from a timing network 58. The clock signal on the line 56 is derived from a counter 88 (FIG. 2) disposed in the timing network 58. The input to the timing network 58 is derived from an external clock 60 over a line 62.

In accordance with this invention the logarithmic ratioing network 50 is realized utilizing no more than two chopper stabilized operational amplifiers. The chopping clock signals having a frequency $f_{chop}$ and a period $t_{chop}$ utilized by the amplifiers are derived from the timing network 58 over a line 64. Preferably the chopper stabilized operational amplifiers are clocked together.

Figure 2:
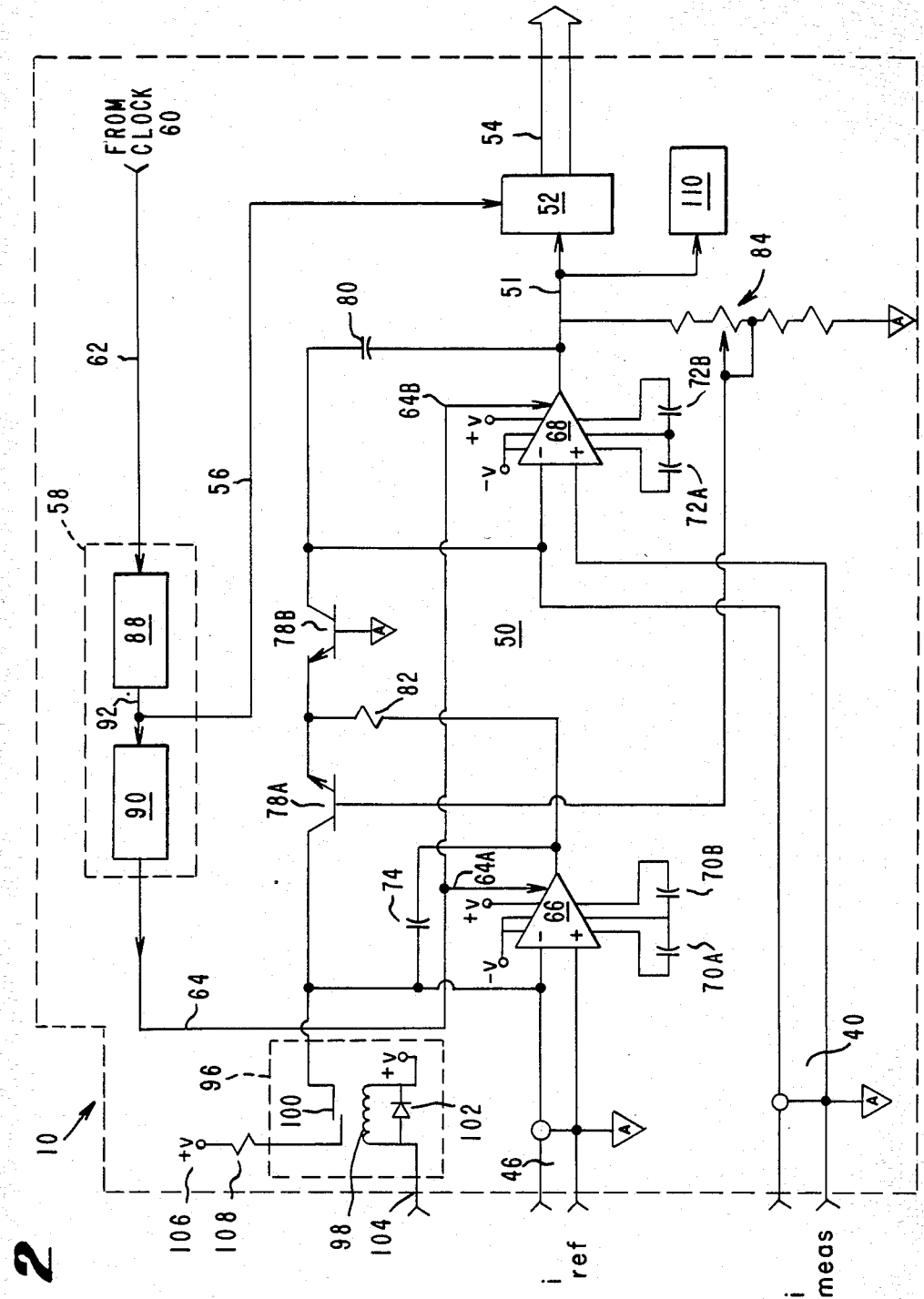
FIG. 2 is a detailed schematic diagram of the data compression system of the instant invention.

With reference to FIG. 2 a detailed schematic diagram of the logarithmic ratioing network 50 and the timing network 60 in accordance with the instant invention is shown. The logarithmic ratioing network 50 includes first and second operational amplifiers 66 and 68 respectively. Suitable for use and preferably used as the operational amplifiers 66 and 68 are chopper stabilized operational amplifiers such as sold by Intersil Inc. of Cupertino, Calif., under model number ICL7650. For a purpose discussed herein each of the amplifiers 66 and 68 is provided with a biasing voltage adapting them for use with an external clock as applied over lines 64A and 64B respectively from the timing network 58. Each of the amplifiers 66 and 68 is appropriately biased and provided with capacitors 70 and 72 of suitable magnitude for storing the correcting potentials used to null the signals applied to the inverting and noninverting inputs thereof. Preferably each of the nulling capacitors 70 and 72 is a polycarbonate capacitor selected for its stability. Suitable for use as the capacitors 70 and 72 are devices made by Electrocube Inc. and sold under model number 6500. A stabilizing capacitor 74 of suitable magnitude is connected between the output of the first amplifier 66 and the inverting terminal thereof.

The reference current signal $i_{ref}$ from the second detector applied over the shielded cable 46 is connected to the first chopper stabilized amplifier 66. The output current $i_{meas}$ from the first detector 38 is applied on the cable 40 to the second chopper stabilized amplifier 68.

The logarithmic ratioing action of the network 50 is provided by a matched pair of transistors 78A and 78B connected in a common emitter configuration. Suitable for use as the transistors 78A and 78B are those manufactured by Intersil Inc. and sold under model number 2N4878. The collector of the transistor 78B is connected to the inverting input of the second chopper stabilized amplifier 68. The output of the second amplifier 68 is also connected to the collector of the transistor 78B through a capacitor 80 of suitable magnitude provided for closed loop stability. The base terminal of the transistor 78B is connected to analog ground.

The collector of the transistor 78A is connected to the inverting input of the first operational amplifier 66. The output of the amplifier 66 is applied through a current limiting resistor 82 to the junction of the emitters of the transistors 78A and 78B. A one percent metal film resistor is preferred for the resistor 78 because it provides less noise. The base terminal of the transistor 78A is connected to a voltage divider network 84 connected between the output of the second amplifier 68 and analog ground. The voltage divider network 84 is provided for temperature compensation of the system.

The logarithmic ratio output signal of the network 50 is derived from the output of the second operational amplifier 68 and is applied over the line 51 to the digital-to-analog converter 52. It has been observed that the use of chopper stabilized operational amplifiers for a logarithmic ratioing network imparts a noise component to the signal output on the line 51. If the two chopper stabilized operational amplifiers chop together, the average value of the output signal due to chopping is zero. In order to make the output of the logarithmic ratioing network 50 compatible for use by the dual slope analog-to-digital converter 52 the period $t_{chop}$ of the chopper stabilized amplifiers 66 and 68 is also made a submultiple of the signal integrate time period $t_{int}$ of the dual slope analog-to-digital converter 52. Alternatively stated, the signal integrate time period $t_{int}$ of the dual slope analog-to-digital converter 52 is an integer number N times the chopping time period of the amplifiers 66 and 68. Mathematically, this relationship may be expressed as $$\frac{t_{int}}{t_{chop}} = N \qquad (1)$$

where
$t_{int}$ is the signal integrate time period of the dual slope analog-to-digital converter;
$t_{chop}$ is the chopping period of the chopper stabilized operational amplifiers; and
N is an integer equal to 1, 2, 3, . . . .
From the relationship between period and frequency it may be observed that the chopping frequency $f_{chop}$ of the stabilized amplifers is equal to N times the inverse of the signal integrate time $t_{int}$. Mathematically, $$f_{chop} = \frac{N}{t_{int}} \quad (2)$$

An arrangement whereby this relationship between chopping frequency $f_{chop}$ and signal integrate time $t_{int}$ may be realized is shown in FIG. 2. Since the period of the analog-to-digital converter 52 is derived from the clock signals provided from the clock 60, the same clock output may be used to generate the timing signals at the appropriate frequency to the amplifiers 66 and 68. To generate the timing signals at the appropriate frequency, the timing network 58 is connected to the clock 60 over the line 62. The timing network 58 includes a first counter 88 the output of which is applied to a second counter 90 over a line 92. The output of the counter 88 is also applied to the converter 52 on the line 58. The counters 88 and 90 are arranged such that the frequency of the timing signals applied to the amplifiers 66 and 68 on the lines 64A and 64B, respectively is equal to the inverse of N times the signal integrate time $t_{int}$. By way of a specific numerical example, if the clock frequency on the line 62 is 1.2275 MHz, the signal on the line 56 is 306.9 kHz. The timing network 58 is arranged to generate timing signals to the amplifiers 66 and 68 on the lines 64 having a chopping frequency $f_{chop}$ of 599.4 Hertz. In this example, N is effectively sixty-four. Suitable for use as the counters 88 and 90 are devices manufactured by Texas Instruments and sold under model numbers 7439 and 74161, respectively. Of course, any suitable timing network 58 to effect the above-discussed purpose may be used.

In accordance with this invention when the chopper stabilized operational amplifiers 66 and 68 are driven together by an external clock, the noise component of the ratio signal output on the line 51 averages to zero. In addition, if the frequency $f_{chop}$ is equal to the inverse of signal integrate time $t_{int}$ of the analog-to-digital converter 52 multiplied by the integer N, the dual slope analog-to-digital converter averages this noise component to zero.

The lamp utilized in the radiation source 14 for the photometer (FIG. 1) must periodically be replaced. In order to insure that the maximum intensity is derived from the replaced lamp bulb a relay network 96 is connected to the collector of the transistor 78A. The relay network 96 includes a coil 98 and a pair of contacts 100. The coil 98 is shunted by a diode 102. When a suitable control signal is applied to the anode of the diode 102 on a line 104 the contacts 100 are closed to cause a supplemental current from a source 106 to flow through a limiting resistor 108. The supplemental current has the effect of disrupting the direct action of the logarithmic ratioing network 50 thereby making the output signal on the line 51 temporarily more dependent upon the magnitude of the intensity of the incident radiation. A monitoring network 110 is connected to the line 51. The monitoring network 110 could be realized using an oscilloscope or meter. If desired, the network 110 may be realized by a microprocessor monitoring the output on the bus 54 in accordance with a program. By monitoring the waveform of the output signal on the line 51 as the bulb is adjusted within the socket 16 it is possible to orient the bulb in the precise position which provides the greatest light intensity for the photometer. When the output signal on line 51 reaches an appropriate peak or valley, as the case may be, the corresponding position of the bulb within the socket 16 provides the maximum light intensity derivable from that bulb. With the adjustment having been made the coil 98 may be deenergized.

Those skilled in the art having the benefit of the teachings hereinabove set forth may effect numerous modifications thereto. However, these modifications are to be construed as lying within the contemplation of the instant invention as defined in the appended claims.

What is claimed is:

1. In an apparatus for photometrically analyzing a sample having
    a replaceable source of radiation receivable in a socket,
    a first detector for generating a first analog electrical signal representative of the intensity of the radiation transmitted from the source through the sample, and
    a second detector for generating a second analog electrical signal representative of the intensity of radiation from the source incident on the sample,
wherein the improvement comprises a data compression system itself comprising:
    a logarithmic ratioing network for generating an analog electrical signal functionally related to the ratio of the first and second analog signals;
    a dual slope analog-to-digital converter having a predetermined signal integrate time $T_{int}$ for converting the analog ratio signal into a digital representation thereof;
    the logarithmic ratioing network having a first and second chopper stabilized operational amplifier, the chopping frequency $f_{chop}$ of each operational amplifier being proportional to an integer number N times the inverse of the signal integrate time $t_{int}$ of the dual slope analog-to-digital converter such that the average value of the output from the converter due to chopping is zero; and
    a network responsive to the position of the source within the socket for locating the same so as to produce the maximum light intensity therefrom, said network comprising:
        a network for applying a predetermined supplemental current to the ratioing network to perturbate the signal output from the ratioing network, the magnitude of the perturbation being related to the position of the source within the socket; and
        a monitoring arrangement for monitoring the output of the ratioing network as the position of the source within the socket is modified, the monitoring network being responsive to the position of the source within the socket to provide an indication of the location of the source which provides the greatest radiation intensity.

2. The photometric analysis apparatus of claim 1 wherein the chopper stabilized operational amplifiers are clocked together.

* * * * *